(12) United States Patent
Shrinivasan et al.

(10) Patent No.: US 6,848,455 B1
(45) Date of Patent: Feb. 1, 2005

(54) METHOD AND APPARATUS FOR REMOVING PHOTORESIST AND POST-ETCH RESIDUE FROM SEMICONDUCTOR SUBSTRATES BY IN-SITU GENERATION OF OXIDIZING SPECIES

(75) Inventors: Krishnan Shrinivasan, San Jose, CA (US); Adrianne Tipton, Fremont, CA (US)

(73) Assignee: Novellus Systems, Inc., San Jose, CA (US)

(*) Notice: Subject to any disclaimer, the term of this patent is extended or adjusted under 35 U.S.C. 154(b) by 256 days.

(21) Appl. No.: 10/128,899

(22) Filed: Apr. 22, 2002

(51) Int. Cl.$^7$ .............................................. C25F 5/00
(52) U.S. Cl. ........................ 134/1.3; 134/31; 134/33; 134/36; 134/137; 134/149; 134/153; 134/184; 134/902; 438/906
(58) Field of Search ........................... 134/1.3, 31, 33, 134/36, 137, 149, 153, 184, 902; 438/906

(56) References Cited

U.S. PATENT DOCUMENTS

| | | | |
|---|---|---|---|
| 5,669,979 A | * 9/1997 | Elliott et al. | 134/1 |
| 5,727,578 A | * 3/1998 | Matthews | 134/61 |
| 5,776,296 A | 7/1998 | Matthews | |
| 5,803,980 A | 9/1998 | Pas et al. | |
| 5,821,175 A | 10/1998 | Engelsberg | |
| 5,911,837 A | * 6/1999 | Matthews | 134/2 |
| 5,954,885 A | 9/1999 | Ohmi | |
| 6,205,676 B1 | 3/2001 | Fujii et al. | |
| 6,224,934 B1 | 5/2001 | Hasei et al. | |
| 6,240,931 B1 | 6/2001 | Fujii et al. | |
| 6,254,689 B1 | 7/2001 | Meder | |
| 6,277,767 B1 | 8/2001 | Shiramizu et al. | |
| 6,295,999 B1 | * 10/2001 | Bran | 134/1.3 |
| 6,310,017 B1 | 10/2001 | Grant et al. | |
| 6,533,902 B1 | * 3/2003 | Miki et al. | 204/157.15 |
| 2002/0157686 A1 | * 10/2002 | Kenny et al. | 134/1.3 |
| 2003/0192570 A1 | * 10/2003 | Thakur et al. | 134/1.3 |

FOREIGN PATENT DOCUMENTS

| | | |
|---|---|---|
| EP | 0 504 431 A1 | 9/1992 |
| EP | 0 548 596 A2 | 6/1993 |
| EP | 0 731 498 A2 | 9/1996 |
| EP | 0 767 487 A1 | 4/1997 |
| JP | 1-111337 | * 4/1989 |
| JP | 08250460 | 9/1996 |
| JP | 09010712 | 1/1997 |
| JP | 09260328 | 10/1997 |
| JP | 09321009 | 12/1997 |
| JP | 10340876 | 12/1998 |
| JP | 11121417 | 4/1999 |
| JP | 11126766 | 5/1999 |
| JP | 11307497 | 11/1999 |

* cited by examiner

*Primary Examiner*—M. Kornakov
(74) *Attorney, Agent, or Firm*—DeLio & Peterson, LLC; Robert Curcio; Roland Tso

(57) ABSTRACT

Contaminants are removed from a semiconductor wafer by the in-situ generation of oxidizing species. These active species are generated by the simultaneous application of ultra-violet radiation and chemicals containing oxidants such as hydrogen peroxide and dissolved ozone. Ultrasonic or megasonic agitation is employed to facilitate removal. Radicals are generated in-situ, thus generating them close to the semiconductor substrate. The process chamber has a means of introducing both gaseous and liquid reagents, through a gas inlet, and a liquid inlet. $O_2$, $O_3$, and $H_2O$ vapor gases are introduced through the gas inlet. $H_2O$ and $H_2O_2$ liquids are introduced through the liquid inlet. Other liquids such as ammonium hydroxide ($NH_4OH$), hydrochloric acid (HCl), hydrofluoric acid (HF), and the like, may be introduced to further constitute those elements of the traditional RCA clean. The chemicals are premixed in a desired ration and to a predetermined level of dilution prior to being introduced into the chamber. The chamber is equipped with megasonic or ultrasonic transducer probe(s), placed in close proximity to the substrate as the substrate rotates with the rotating platen.

28 Claims, 7 Drawing Sheets

METHOD AND APPARATUS FOR REMOVING PHOTORESIST AND POST-ETCH RESIDUE FROM SEMICONDUCTOR SUBSTRATES BY IN-SITU GENERATION OF OXIDIZING SPECIES

BACKGROUND OF THE INVENTION

1. Field of the Invention

The present invention relates to a cleaning process for a semiconductor manufacturing system, and particularly to removing contaminants from a semiconductor substrate surface during processing. More particularly, the invention relates to removal of contaminants from a semiconductor wafer by in-situ generation of oxidizing species. These active species are generated by the simultaneous application of ultra-violet radiation and chemicals containing oxidants such as hydrogen peroxide and dissolved ozone. The invention also relates to enhancement of the oxidation reactions from removing contaminants by the application of ultrasonic or megasonic agitation. Further, the invention relates to the removal of reaction products by rotation of the substrate.

2. Description of Related Art

The fabrication of Integrated Circuits (IC's) on a semiconductor substrate can properly be divided into two sets of processes. The first set of these processes, called in industry parlance, "Front End-Of-Line" (FEOL), is used to lay the building blocks of the transistors that make up an IC. In this set of processes, various selected areas of the substrate are exposed to implantation of impurities such as phosphorous, boron, or arsenic in order to create p-type or n-type regions. In the manufacturing cycle for an IC, a sequence of discrete steps are used to define these regions so that only selected areas of the semiconductor are subjected to this process of doping. This begins with the deposition of a layer of photoresist. The photoresist layer is dried and cured after being deposited. The photoresist is photoactive, and can be modified by exposure to selected forms of radiant energy. Exposure of the resist is performed in a photolithography step where the substrate is exposed to radiant energy of selected wavelengths through a mask. This mask defines those areas of the photoresist-coated substrate, which are subjected to the radiation, and those that are not. Typically the areas of photoresist that are subject to the radiation are modified and can be removed by developing in much the same way as in photography. This method of pattern transfer (from mask to substrate) leaves photoresist covering those areas of the substrate that were shielded by the mask.

Ion implantation is then used to drive dopants such as phosphorous, boron or arsenic into those areas of the substrate that are not protected by the photoresist. Subsequent to this step, all the photoresist must be removed before the substrates are annealed, oxidized or processed in diffusion furnaces. Currently, post-implant photoresist removal is performed in one of two ways. Wet processing involves the use of a mixture of sulfuric acid and hydrogen peroxide to remove the resist and other organic contaminants that might be present. Photoresist can also be removed using dry processes, typically involving the use of plasma oxidation. In a plasma process, a source of oxidant, such as oxygen, is introduced into a plasma field excited either by radio frequency or microwave frequency energy. The semiconductor substrate is also heated to temperatures in excess of 200° C. to enhance the rate of the photoresist removal. In the example cited above, diatomic oxygen breaks up into intermediate mono-atomic oxygen radicals, which then act on the organic photoresist. In most cases, the substrate may still be dipped in a mixture of sulfuric acid and hydrogen peroxide after a plasma process is used to remove photoresist. This sequence of steps may be repeated more than once depending on the complexity of the integrated circuit that is being developed by repeated patterning of regions for introduction of various dopants.

The recent process trends in the manufacture of IC's have caused an increase in the level of doping. This has been achieved by increasing the energy and density of the ion flux directed at the substrate during the implantation process. As a consequence, the surface of the photoresist that shields certain areas of the substrate from the ion implantation process is itself modified. Due to the high energy and flux density, surface layers of the photoresist undergo chemical and physical modification. The higher temperatures resulting from the ion bombardment cause further baking and hardening of the top layer. Also, the ion flux causes implantation of the resist with the dopant atoms. Moreover, the photoresist undergoes significant cross-linking and becomes more resistant to post-implant removal processes.

Dry photoresist stripping by using plasma processes has had significant difficulty in overcoming these crusted surface layers. One problem frequently noted in dry stripping is that of crust "popping." This occurs when the substrate is heated for dry stripping, and the solvent in the soft photoresist bulk underlying the crust begins to evaporate. The solvent vapors are released by breaking through the brittle crust, which in turn causes a significant distribution of particulate contamination on the substrate. Plasma processes have had to be modified to include a degree of Reactive Ion Etching (RIE) so that the crust may be removed at low temperature before the softer bulk resist is striped using a traditional downstream plasma process. RIE, involving the acceleration of oxygen or argon ions towards the substrate, which is held under an electrical bias, has been known to cause charge damage to the sensitive devices created on the substrate.

After the photoresist has been removed, either by wet processing in a sulfuric-peroxide mixture or by dry plasma stripping, the substrate is subjected to an RCA clean. This is actually a sequence of wet processes aimed at removing various kinds of contaminants prior to a high temperature process such as diffusion, oxidation or annealing. The RCA typically incorporates the following elements: a) preliminary cleaning in a mixture of sulfuric acid and hydrogen peroxide to remove organic contaminants, including photoresist if so desired; b) removal of organic contaminants, particulates, and certain metals by immersion in an aqueous solution of ammonium hydroxide and hydrogen peroxide; c) removal of thin oxide film generated by the previous step by immersion in an aqueous hydrofluoric acid (unless layer is already coated with oxide); d) removal of the remaining metallic contaminants by immersion in an aqueous solution of hydrochloric acid and hydrogen peroxide; and e) drying.

Following each of steps a through d, the substrates are immersed in de-ionized water so that they may be rinsed of residual chemicals. Spin-spray processes, which use far smaller quantities of chemicals, may replace the immersion processes.

Recent process trends have been aimed at replacing the sulphuric acid/hydrogen peroxide mixture with ozonated de-ionized water. Another process trend has been to reduce the concentration of the ammonium hydroxide/hydrogen peroxide mixture and the hydrochloric acid/hydrogen peroxide mixture solutions that comprise the RCA clean by employing megasonic and ultrasonic enhancement techniques.

Megasonic cleaning technology was developed to complement the RCA wet chemical process and to enhance removal of organic films and particles. In the megasonic process, wafers are immersed in water, alcohols, or dilute SC1 solutions and exposed to sonic waves, typically in the range of 850 to 900 KHz. Ultrasonic cleaning works on the same principle, but uses liquid cavitation frequencies in the range of 20 to 80 KHz and power densities fifty-times greater than that used for megasonic applications. Both ultrasonic and megasonic cleaning processes operate on the principle of introducing cavitation and miro-acoustic streaming to enhance rates of mass transfer. All wet processes are handicapped by the slow rates of diffusion of reactants to the substrate surface and the diffusion of reaction products away from the cleaned surface. These diffusion rates are slow because of the thick hydrodynamic boundary layers that are typically established over the substrate surface as the cleaning solution flows over them. To overcome this, megasonic and ultrasonic transducers create additional mechanical agitation. The sound energy that is coupled into the liquids by these transducers cause cavitation, i.e., generation of gas and vapor bubbles in the boundary layer. The subsequent collapse of these bubbles generates streaming effects within the relatively quiescent hydrodynamic boundary layer, thereby causing more agitation. Megasonic excitation adds the effect known as micro-acoustic streaming, whereby pulsating flow caused by the sound waves are transferred into the hydrodynamic boundary layer with a similar effect.

A traditional method for treating semiconductor substrates and removing residual organic films includes the use of ozonated water or other ozonated reagents. This method is typically comprised of the following distinct process steps: a) generation of ozone; b) dissolution of ozone in de-ionized water or reagent; and c) introduction of ozonated water or reagent into the reactor or chamber. However, each of the above steps is neither effective nor efficient. Ozone is generally created by corona discharge in oxygen. This ozone generation process remains extremely inefficient. At best, only a few percent of all oxygen is converted to ozone. Moreover, the ozone generated has a short half-life, and has to be dissolved into de-ionized water and delivered to the process chamber very quickly. Ozone is dissolved in de-ionized water or other reagent through a contactor, such as a bubbler or membrane module. Ozone dissolution is a slow process and the de-ionized water may not reach saturation in the contractor. At best, commercial ozone generators achieve concentrations on the order of forty (40) parts per million in de-ionized water. This represents a very low rate of ozone generation, typically up to 5%, and a low level of saturation in the ozone generator.

Transfer of the ozonated water from the contractor into the substrate-processing chamber can cause further loss of ozone by dissociation to oxygen. Furthermore, transport of these small concentrations of dissolved ozone to the reaction sites on the semiconductor substrate is subject to mass transport restrictions. Although various methods such as ultrasonic and megasonic excitation have been introduced to enhance the mass transport, none of the current methods enhance the availability of ozone near the reaction sites. Thus, because of this small amount of ozone in the solution, there can only be a limited amount of oxidizing species.

Another recent trend has seen the increased use of ozonated de-ionized water to replace hydrogen peroxide in the cleaning process. Some processes use ozone dissolved in de-ionized water and mixed with either hydrochloric or hydrofluoric acid to develop a uniform and contaminant-free silicon dioxide layer at the surface of the semiconductor substrate.

In addition to the FEOL processes described above, there are a number of Back-End-Of-Line (BEOL) processes that require stripping of photoresist and removing of organic residues that result from etch processes. The Back End-of-Line (BEOL) refers to that set of process steps which connects the various transistors that were defined in the Front End-of-Line. To provide for this interconnection, alternating layers of dielectric material and metal are deposited and etched to form microscopic "wiring" for the integrated circuit. In a typical dual-Damascene integration, a layer of dielectric material is deposited on the substrate. This dielectric material is then patterned using photoresist deposition, curing, photolithography, and development in much the same way as in the Front End-of-Line. However, instead of ion implementation, a plasma process is used to etch features into dielectric material. In one example of a dual-Damascene integration scheme, vias are first etched into the dielectric. These vias are the holes used to establish conductive contact between layers of metal on either side of the dielectric layer. After vias have been etched, the photoresist must be removed and the substrate cleaned prior to the next patterning and etching process, e.g., patterning and etching for trenches. Trenches constitute the next layer of metal. After trenches have been etched, the photoresist used to delineate areas for etching also has to be removed. Once trenches and vias have been etched into the dielectric, conductive barriers and metal layers are deposited first to make contact with the metal layer underlying the dielectric, and then to build up the next metal layer. By repeating this sequence of deposition and etching up to 10 layers of metal are usually created, thus providing the wiring for the integrated circuit.

In the dual-Damascene scheme described above, the photoresist layers are also subject to heavy bombardment of ions during etching, The dielectric materials are typically etched using a fluorine containing etchant gas. The resulting plasma contains many ionic fluorine species that chemically and physically alter the photoresist. High-density plasma is finding greater application in etching and typically results in a larger flux of ions at the substrate surface. This causes cross-linking and fluorination of the photoresist layer at the top surface. In a manner similar to that seen in the Front End-of-Line, a crust of cross-linked polymer is formed on top of softer unmodified photoresist. This crust is very stable and impervious to traditional downstream oxygen plasmas that have been used for photoresist removal.

Typically, these resist layers are removed using RIE plasma processes with oxygen or fluorine-containing species as the reactants. Reducing chemistries employing hydrogen, forming gas (a mixture of $N_2$ and $H_2$), and forming ammonia have also been employed for stripping resist and removing post-etch residue. Plasma processes that have been commonly used for traditional structures that employ $SiO_2$ as the inter-layer dielectric do not result in any damage to the dielectric material. However, the introduction of carbon-doped oxides, such as CORAL® from Novellus Systems, Inc., BLACK DIAMOND® from Applied Materials, and the like, has resulted in associated problems with plasma-based strip and clean processes. The aggressive atomic and ionic species generated by plasmas have modified the structure of these inter-layer dielectric materials, and consequently augment the value of critical material properties, such as their associated dielectric constant ($\kappa$).

As device geometries shrink, the semiconductor roadmap calls for the introduction of materials with low dielectric constant values. Some organic dielectric materials are now currently being tested for future semiconductor devices.

These organic materials, e.g., SiLK® from Dow Chemicals, are similar in their chemical composition and reactivity to the photoresist layers used to define etching patterns. Use of plasma processes, therefore, may not be possible at all for removing photoresist and post-etch residue from substrates incorporating organic dielectric materials. The use of oxygen plasma, for example, has been ruled out by the similar etch rates demonstrated by SiLK® and photoresist in these conditions. Consequently, a need exists in the art for the development of alternative stripping and cleaning processes that do not affect or materially alter the properties of the dielectric materials.

Bearing in mind the problems and deficiencies of the prior art for both FEOL and BEOL photoresist strip processes, it is an objective of the present invention to provide a method for removal of photoresist and organic contamination without damaging the underlying layers. In the FEOL processes, it is the objective of this process to remove heavily cross-linked and implanted resist crust without causing particulate contamination by "popping." It is also the objective of this invention to provide for the photoresist removal without subjecting the substrate to the deleterious effects of reactive ion etching.

It is a further object of the present invention to integrate the photoresist removal step with the subsequent cleaning steps employed in the RCA clean process.

Another object of the present invention is to successfully integrate the entire photoresist strip and RCA clean process currently practiced in one chamber. It is a further object of the present invention to allow for a reactor equipped with sufficient functionality such that all the various cleaning steps may be performed in sequence in one chamber without the need for handling between each of the steps that constitute an RCA clean.

Yet another object of the present invention is to enhance the rate of resist removal by providing for ultrasonic or megasonic excitation near the substrate, and preferably coupled to the substrate through a thin layer of reactant fluid on its surface. It is an objective of this invention to enhance transport of active ingredients from the bulk reactant fluid to the surface of the substrate by means of megasonic and ultrasonic excitation. It is also the corresponding objective of this invention to enhance transport of the products of reaction away from the substrate surface by combination of megasonic and ultrasonic excitation with centrifugal forces resulting from substrate rotation. It is another object of the present invention to provide for the generation of active oxidizing species near the substrate surface so that they may be available in close proximity to the reaction sites. It is the further object of this invention to increase the source materials for these active species by employing reagents that are highly soluble in aqueous media.

In the BEOL processes, it is an object of the present invention to remove the heavily cross-lined and fluorinated resist crust without causing damage to the underlying dielectric layers. It is a further object of the present invention to remove post-etch residue from the vias and trenches that have been etched in a prior step.

Yet another object of the present invention is to integrate in one chamber all the cleaning and drying steps necessary for the removal of photoresist and organic residues from vias and trenches. It is a further objective of the invention to provide for removal of residue from within vias and trenches by providing for ultrasonic and megasonic excitation. Another object of the present invention is to remove resist and residue by providing for the in-situ generation of oxidizing species from water-soluble reagents.

SUMMARY OF THE INVENTION

The above and other objects, which will be apparent to those skilled in art, are achieved in the present invention, which is directed to a method for the removal of contaminants on a semiconductor wafer surface in a process chamber comprising: processing the wafer with a liquid reagent mixture; conducting the liquid reagent mixture to the wafer surface; rotating the wafer on a platen; coupling sonic energy to a thin layer of the liquid reagent mixture on the rotating wafer surface; and coupling ultraviolet energy in-situ within the chamber to generate radicals at the wafer surface. This method further includes processing with de-ionized water mixed with hydrogen peroxide. The liquid reagent may comprise water, $H_2O_2$, ammonium hydroxide, hydrochloric acid, or hydrofluoric acid. Gaseous reagents may be added to the process chamber through a gas inlet.

Coupling the sonic energy to a thin layer of the liquid reagent mixture may be accomplished by submerging a megasonic or ultrasonic transducer probe in a thin layer of the liquid reagent mixture on the wafer surface or embedding a piezoelectric array within the platen and electrically activating the array. Hydrogen peroxide is decomposed into hydroxyl and peroxyl radicals by the ultraviolet energy. The ultraviolet energy is introduced by the illumination of ultraviolet lamps or ultra-violet excimer lasers. Ozone may be added to the liquid reagent mixture by introducing oxygen into an ozone generator and bringing the ozone into contact with the liquid reagent mixture via a membrane module or contactor.

The gas introduced into the chamber may be comprised of $O_2$, $O_3$, or any other desired reactant.

The chamber is adapted to raise and lower the megasonic or ultrasonic probe towards and away from the wafer.

In a second aspect the present invention is directed to a method for the removal of contaminants on a semiconductor wafer surface in a process chamber comprising: mixing a solution of ultra-pure de-ionized water and hydrogen peroxide; generating ozone outside the chamber; combining the ozone to the de-ionizing water and the hydrogen peroxide solution outside the chamber; rotating the wafer; applying the ozone mixed with the solution to the wafer surface; agitating the ozone mixed with the solution at the wafer surface with a sonic energy transducer; and irradiating the ozone mixed with the solution with ultraviolet energy.

In a third aspect the present invention is directed to an apparatus adapted to remove contaminants on a semiconductor wafer surface comprising: a process chamber; a liquid inlet mounted on the chamber; a liquid reagent mixture introduced through the liquid inlet; a rotating platen supporting the wafer; a sonic energy probe adapted to contact a thin layer of the liquid reagent mixture on the rotating wafer surface; and an ultraviolet energy source activated in-situ within the chamber to generate radicals at the wafer surface. A gas inlet may be introduced for adding gas to the process chamber.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–10 of the drawings in which like numerals refer to like features of the invention.

The use of hydrogen peroxide supplemented by ultra-violet energy has been known in the art. Ultra-violet peroxide processes are used to rid water of low-level organic contaminants, and also to disinfect. Ultra-violet energy breaks down hydrogen peroxide into hydroxyl and peroxyl radicals, which are aggressive oxidizers. This breakdown may be represented as follows:

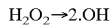

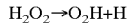

The radicals oxidize the organic contaminants ultimately resulting in the formation of carbon dioxide and water. They are also effective at breaking carbon-carbon (C—C) bonds in polymers rendering them more digestible by other means.

Figure 1:
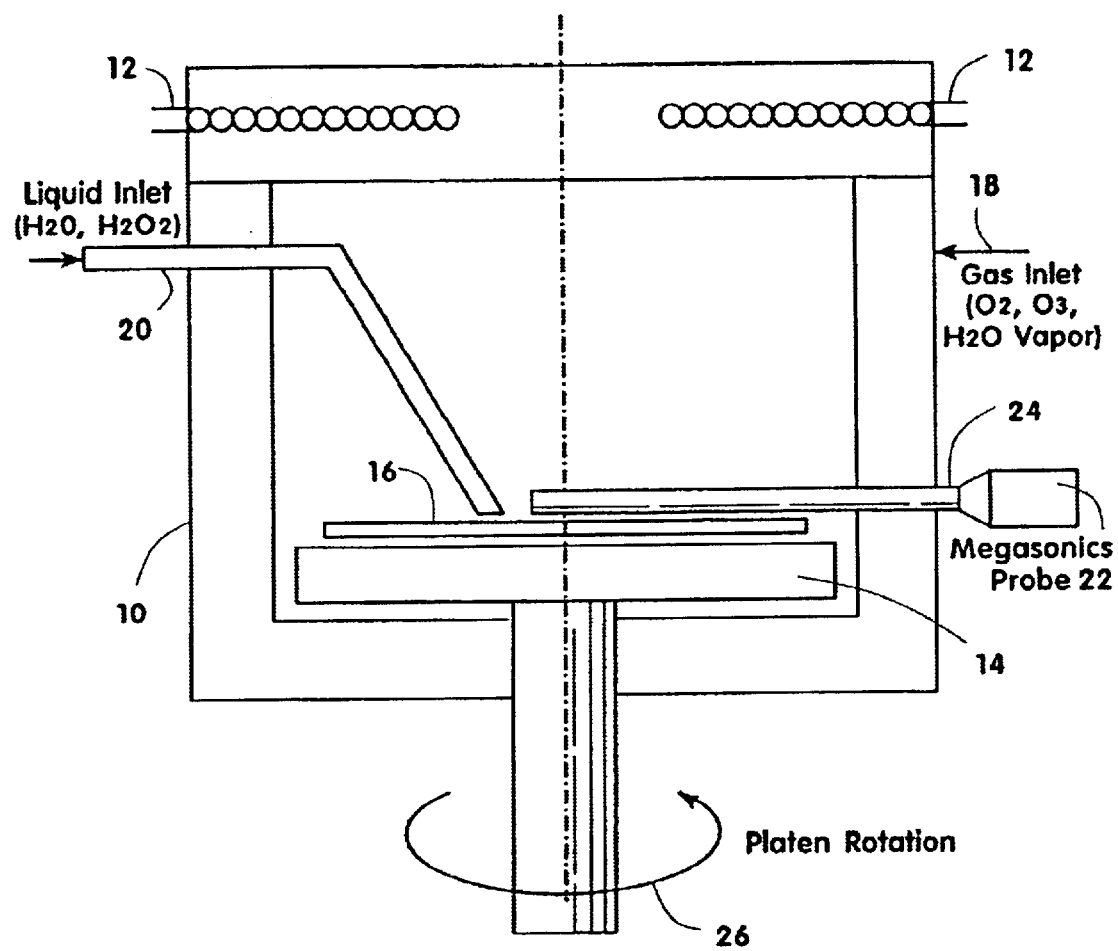
FIG. 1 is a schematic of a chamber for introducing gaseous and liquid reagents simultaneously with ultra-violet excitation and megasonic or ultrasonic agitation.

The method disclosed herein generates radicals in-situ, thus generating them close to the semiconductor substrate. Referring to FIG. 1, a source of ultra-violet light 12 is assembled at the top of a chamber 10. The chamber 10 typically contains a platen 14 capable of receiving a semiconductor substrate or wafer 16 of appreciable size. The platen 14 is rotated at a controlled rate by means of a motor. The chamber 10 also has a means of introducing both gaseous and liquid reagents, through a gas inlet 18, and a liquid inlet 20. Gases introduced through the gas inlet 18 may include $O_2$, $O_3$, $H_2O$ vapor, and any other reagent. Liquids introduced through the liquid inlet 20 include $H_2O$ and $H_2O_2$. Other liquid solutions such as ammonium hydroxide ($NH_4OH$), hydrochloric acid (HCl), hydrofluoric acid (HF), and the like, may be introduced to further constitute those elements of the traditional RCA clean. The present invention provides a way to combine and integrate these chemical elements. In the preferred embodiment, these chemicals are pre-mixed in a desired ratio and to a predetermined level of dilution prior to being introduced into the chamber 10. The chamber is equipped with megasonic or ultrasonic transducer probe(s) 22, placed in close proximity to the substrate as the substrate rotates with the rotating platen. The ultrasonic and megasonic transducer probes 22 may be made of a compatible material such as quartz, silicon carbide, or alumina. A piezoelectric transducer (not shown) mounted outside the process chamber may be used to excite this probe. The probe 22 penetrates the chamber walls through a sealed penetration 24. The probe may extend to slightly beyond the center point of the substrate 16 when the substrate is placed on the platen.

Figure 2:
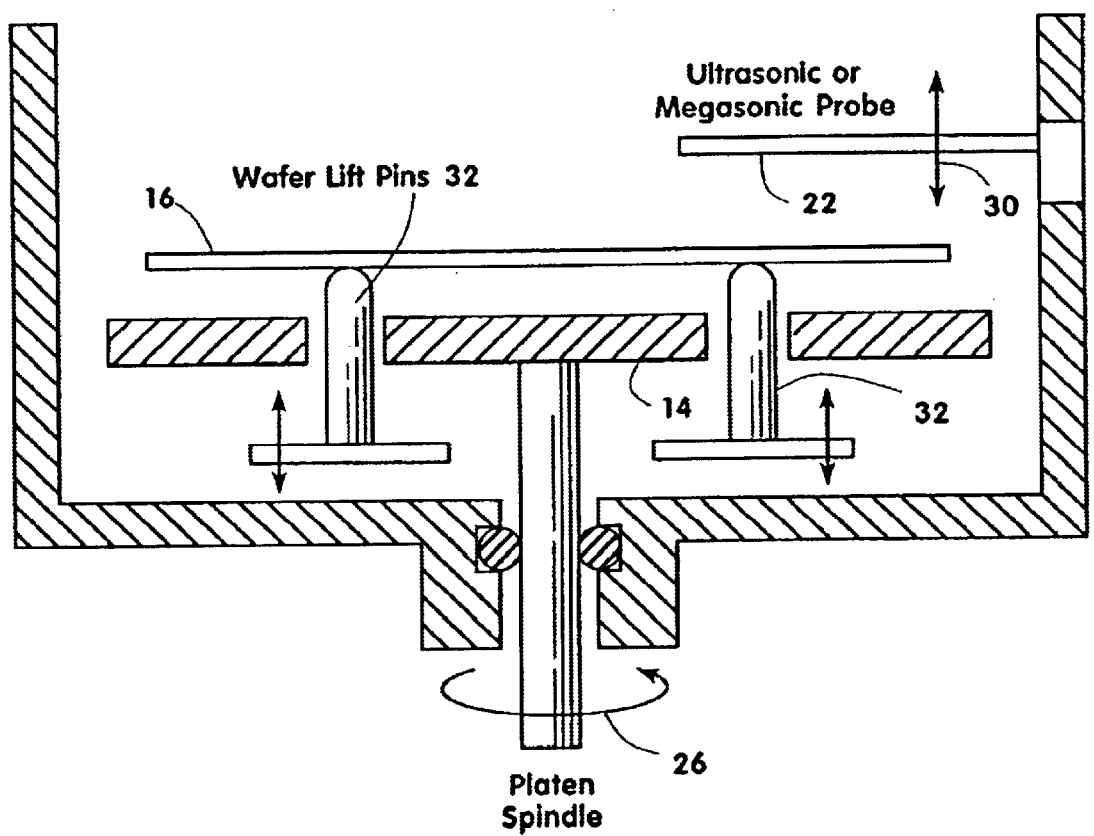
FIG. 2 is a schematic of the chamber of FIG. 1 depicting a lifting mechanism for the megasonic or ultrasonic probe, and wafer lift pins.

The probe may also be adapted to allow for a mechanism to raise and lower the probe. FIG. 2 illustrates this embodiment. This would allow for the robotic introduction of the substrate on the platen. In this environment, the probe 22 would be retracted or lifted mechanically 30 when a substrate is being placed in the chamber. The substrate 16 is then placed on retractable pins 32 that extend above the platen surface. Once the wafer-handling mechanism (not shown) has withdrawn, the pins 32 retract, placing the substrate onto the platen 14. The probe 22 is then lowered within close proximity of the substrate, typically at a distance between 100 microns and 5 millimeters.

Importantly, the platen and substrate are rotated 26 to bring all areas of the substrate under the influence of the probe. Rotation of the platen also facilitates removal of the products of reaction from the substrate surface, and provides the substrate with fresh reactant.

Figure 3:
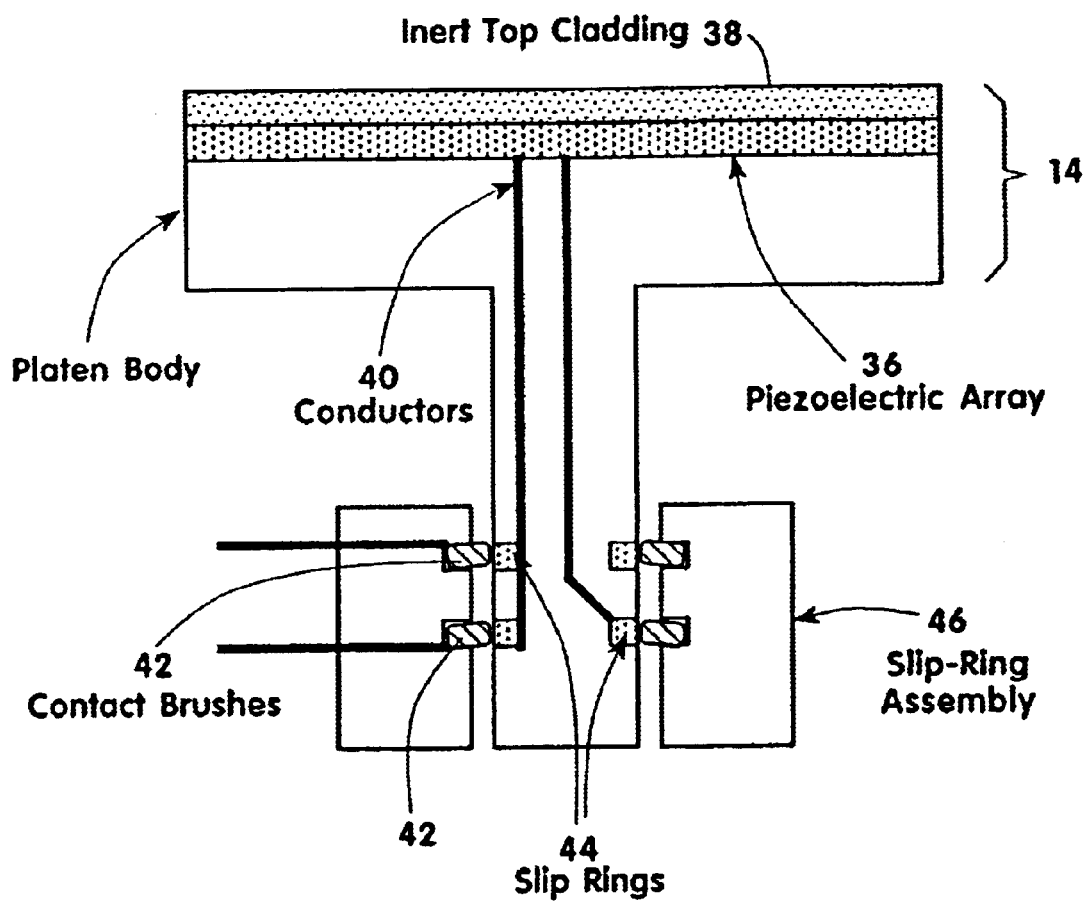
FIG. 3 is a schematic of the chamber of FIG. 1 depicting a platen having an embedded megasonic or ultrasonic transducer.

In FIG. 3, the platen 14 is shown constituting or containing an embedded ultrasonic or megasonic transducer 36. An inert top cladding 38 made from a suitable material such as quartz, silicon carbide or alumina is used to cover a piezoelectric transducer 36. The piezoelectric transducers embedded in the platen provide excitation to the substrate resting on its top surface. Conductors 40 provide the electrical excitation for these transducers. Electrical connection is made via brush contacts 42 located at the stem of the platen. Slip rings 44 within a slip ring assembly 46 make electrical contact with the conductors 40 while providing rotational movement for the platen. In this embodiment, rotation of the platen provides chiefly for the removal of reaction products from the substrate surface and any subsequent provision of fresh reactant.

In one embodiment, the semiconductor substrate is processed with a liquid reagent. De-ionized water mixed with hydrogen peroxide is injected into the chamber via the liquid inlet 20 and conducted to the substrate surface. The substrate 16 is rotated on the platen 14 and the ultrasonic or megasonic transducer probe 22 is brought into close proximity to the substrate surface. The sonic energy from the transducer is coupled to the substrate by submerging the ultrasonic or megasonic transducer in the thin layer of liquid reagent on the semiconductor surface. The ultra-violent lamps 12 are used to excite the peroxide, generating radicals in-situ. The platen rotation 26 brings all areas of the substrate under the effect of the ultrasonic or megasonic probe 22. In those cases where the ultrasonic or megasonic transducer is embedded into the platen itself, rotation only serves to remove the products of reaction from the wafer surface and facilitate the provision of fresh reagent to all areas of the substrate. The rate of rotation may range from a few revolutions per minute (RPM) to well in excess of a thousand RPMs, though this is process dependent. The rate of reagent replenishment is dependent on the centrifugal forces set up by the rotating platen, which causes a hydrodynamic boundary layer to be established across the substrate. Ultrasonic or megasonic excitation enhances the transport of reagent across this hydrodynamic boundary layer by the aforementioned phenomena of bubble cavitation and miro-acoustic streaming A port, typically provided at the bottom of the chamber below the platen, serves as a drain for spent reagent and other products of reaction.

The generation of oxidizing species is enhanced by the addition of dissolved ozone to the hydrogen peroxide. This reaction can be summarized by the following equation:

$$2O_3 + H_2O_2 \rightarrow 2HO + 3O_2$$

Figure 4:
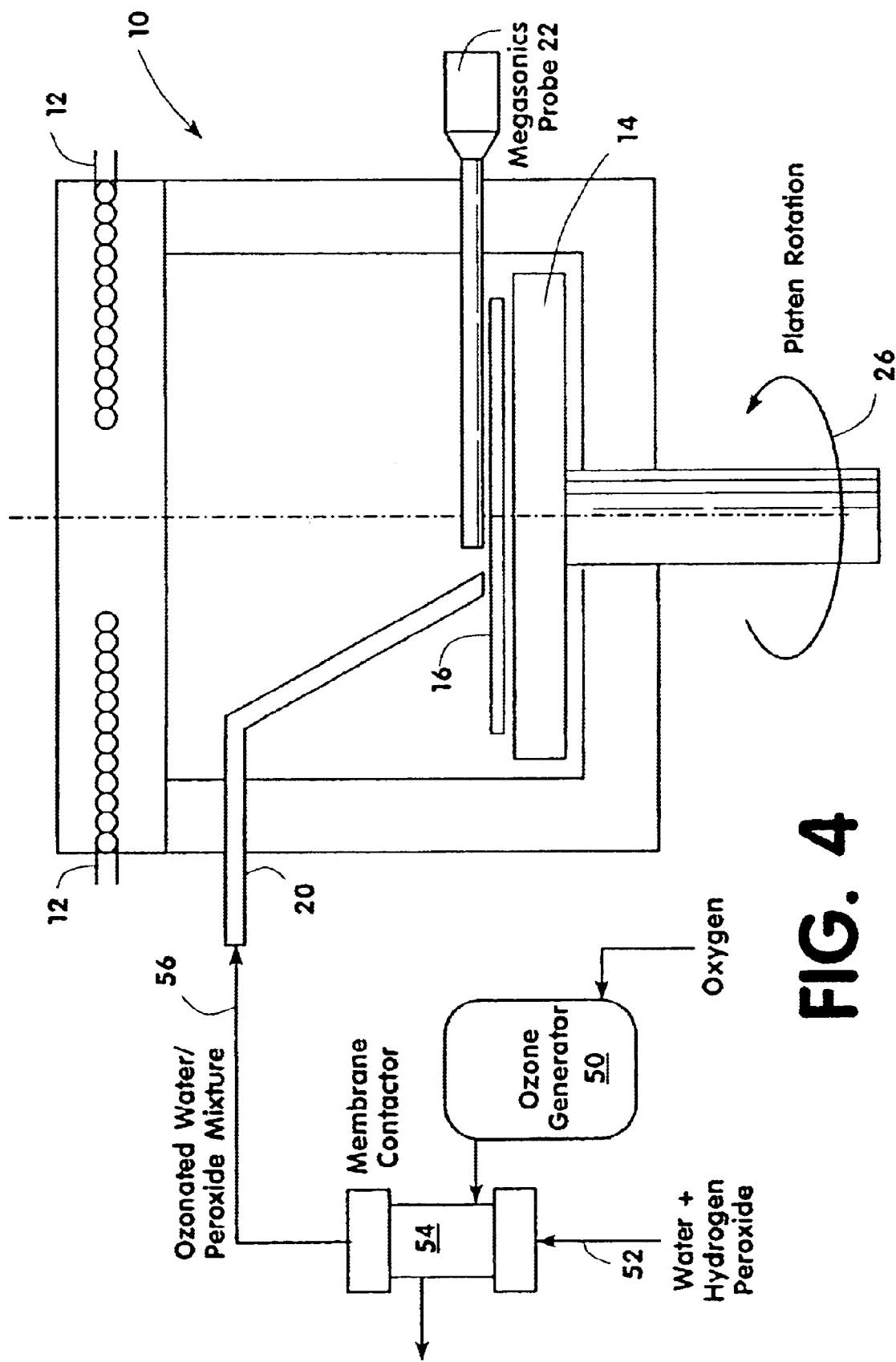
FIG. 4 is a schematic depicting an apparatus for the introduction of dissolved ozone into a chamber similar to that in FIG. 1.

In another embodiment, ozone is added to the water/peroxide mixture to accelerate generation of the highly reactive hydroxyl radicals. Alternatively, ozone may be added directly into the chamber. FIG. 4 depicts schematically the preferred introduction of ozone into the chamber. Oxygen is received into an ozone generator 50, preferably a corona discharge device although other types of ozone generators may be used. The generated ozone is then brought into contact with the water/peroxide mixture 52 via a membrane module or contactor 54. The ozonated water/peroxide mixture 56 is then injected into the process chamber through the liquid inlet 20. The radicals generated in close proximity to the reaction sites provide enough energy to break the polymer bonds and to oxidize any organic residue. The mechanical action imparted by the ultrasonic or megasonic transducer probe 22, and the concurrent rotation of the substrate 16 on platen 14 assists the removal of byproducts caused by the radical-generated reactions from the substrate surface. Thus, even if the radicals do not complete the digestion or breakdown of the oxidizing organic residue, the mechanical action of the transducer and platen rotation effectively ensures residue removal.

In a further embodiment, the water-hydrogen peroxide solution may additionally contain ammonium hydroxide. This constitutes the second step of the RCA clean. Ammonium hydroxide removes certain metals and particulate contamination from the substrate surface. The presence of hydrogen peroxide suppresses the potential for oxide etching by the ammonium hydroxide. In this invention the additional reactivity imparted by ultra-violet excitation and the additional mass transport efficiency realized by the imparting of megasonic or ultrasonic excitation reduces the need for highly concentrated solutions. Also the megasonic or ultrasonic excitation may be useful in accelerating the removal of particulate contamination.

Moreover, the addition of hydrochloric acid to this water-peroxide mixture completes another step of the RCA clean. The excitation provided by ultra-violet radiation reduces the amount of hydrogen peroxide needed for the process to be efficient. Equally, ultrasonic or megasonic excitation increases the mass transport necessary to get the excited species to the substrate surface. This process may also include the blanketing of the substrate with a predetermined gas. Typically, the introduction of a gas requires a reliance on diffusion to transport the gas to the water surface. However, gases such as ozone may be combined and present within the reagent, and thus, the process is not dependent upon diffusion.

Finally, drying of the substrate is accomplished in the same chamber by a combination of spinning and the introduction of a hot gas. Preferably, hot nitrogen or hot isopropyl alcohol (IPA) vapor is used to dry substrates. These hot gases may be introduced separately into the chamber while spinning the substrate at a high rate of revolutions. The combined action of centrifugal force and the thermal energy imparted by the hot gases accelerates drying of the substrate.

This process has proved successful in the removal of a resist and residue following a dielectric etch in the Back-End-Of-Line (BEOL); one of the more challenging process requirements. For example, in the integration of a Novellus Systems' CORAL® dielectric, the unwanted residue to be removed after etching consists of the following elements: a) photoresist; b) fluorinated crust (located on top of the resist, and formed by ion bombardment during etching); c) via sidewall residue; d) via bottom residue; and e) bottom anti-reflection coating (BARC). Removal of the residues is complicated since these residues are all chemically distinct from one another. Some residue portions, including the crust and sidewall residue are heavily fluorinated and cross-linked. These stable polymers are resistant to all but the most aggressive plasma chemistries. Performing the preferred removal process after etching of a CORAL® dielectric confirmed that all the photoresist and residue had been effectively removed.

Figure 5:
FIG. 5 is a copy of a scanning electron microscope (SEM) photograph of a dual-damascene stack of CORAL® as received for testing after via etch process.
Figure 6:
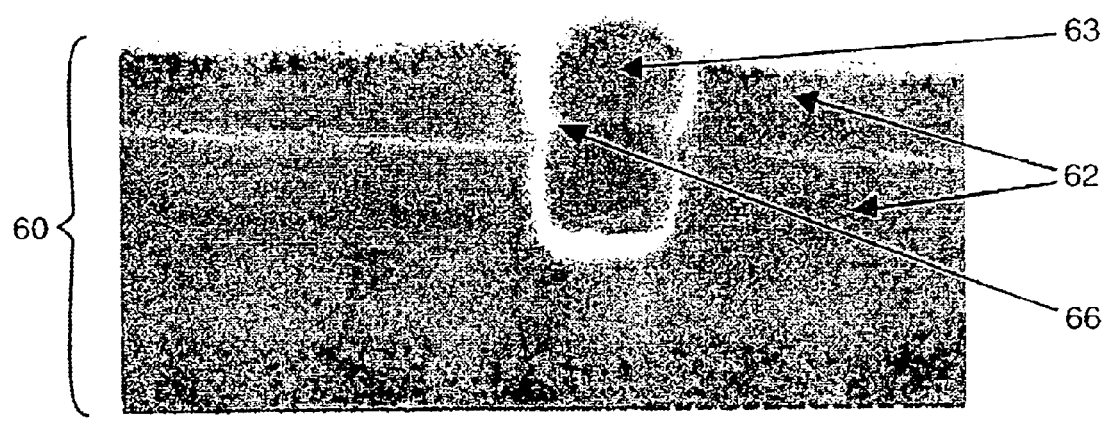
FIG. 6 is a copy of a 35K magnification SEM photograph of a dual-damascene stack of CORAL® of FIG. 5 after ultraviolet processing with hydrogen peroxide.
Figure 7:
FIG. 7 depicts two adjacent vias in the dual-damascene stack of CORAL® of FIG. 5 after ultraviolet processing with hydrogen peroxide.
Figure 8:
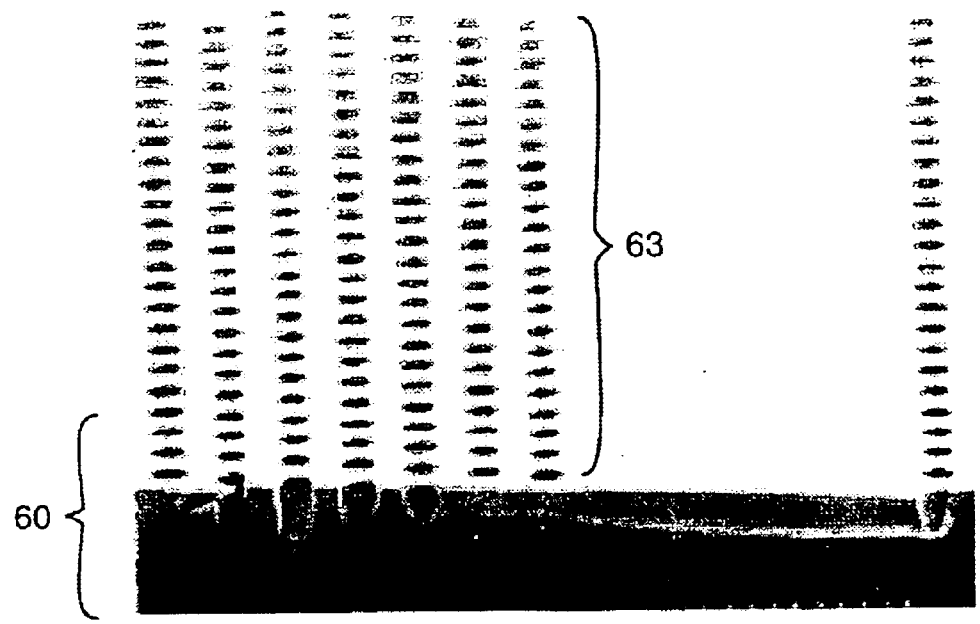
FIG. 8 represents a copy of a SEM showing an entire field of vias in a dual-damascene stack of CORAL® of FIG. 5 after ultraviolet processing with hydrogen peroxide.

FIG. 5 is a copy of an electron microscope (SEM) photograph of a CORAL® sample 60 as received for testing. The sample show two a dual-damascene stacks of CORAL® 62 with a photoresist as the top layer 64. The cross-section viewed in FIG. 5 also depicts the extent to which the top layer of photoresist has been cross-lined, fluorinated, and otherwise densified. This is visible through the contrast in shade between the top of the photoresist layer and its bottom. Also, it must be noted, the delineation of the intermediate etch stop 66 within the via feature 63 is itself not clear, indicating the presence of a sidewall polymer generated and deposited during the etch process. The sample 60 was processed using a 50% solution of hydrogen peroxide and a single ultraviolet lamp for 1.5 hours at room temperature (20° C.). The combination of the peroxide solution and ultraviolet energy allows for sufficient oxidizing species to breakdown any cross-link bonds. FIG. 6 is a copy of 35K magnification electron microscope photograph of the dual-damascene stack of CORAL® 62 after processing. In FIG. 6, a close-up of one via feature 63 on the test sample 60 is depicted. As shown, after hydrogen peroxide processing under the ultra-violet radiation, the photoresist and sidewall polymer have been completely removed. The delineation of an intermediate etch stop 66 is also indicated. FIG. 7 represents a copy of a 25K magnification electron microscope photograph depicting two adjacent features or stacks 62 of the sample 60 after hydrogen peroxide processing under ultra-violet irradiation. FIG. 8 represents a copy of an 8K-magnification electron microscope photograph depicting the processed wafer of sample 60. As indicated in FIG. 8, the field of via features 63 depicts uniform removal of resist across the entire sample 60.

In contrast to the effective removal from sample 60 of resist and residue through peroxide processing under ultra-violet irradiation, other samples were exposed to either ultraviolet processing or peroxide processing, but not both.

Figure 9:
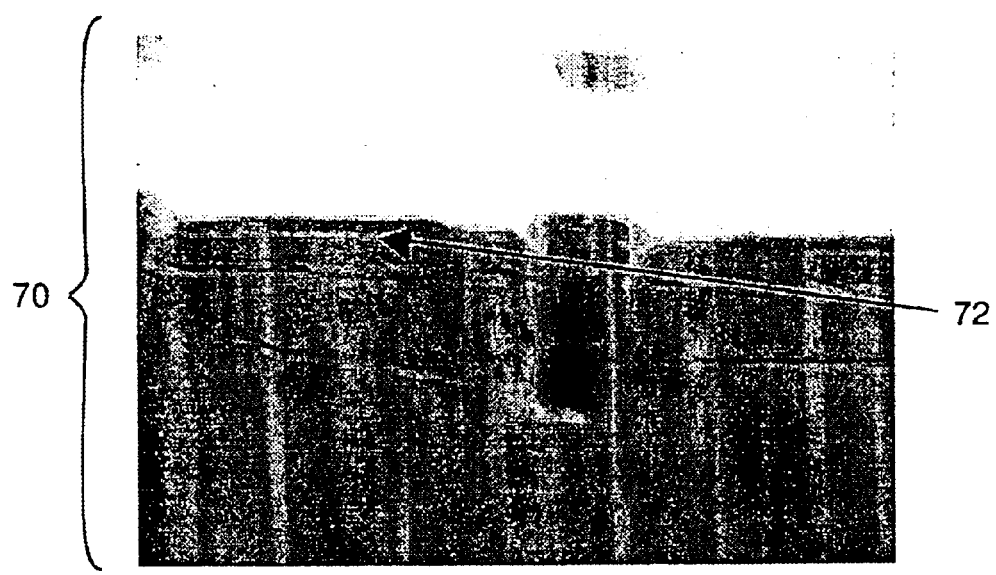
FIG. 9 depicts a copy of a SEM showing a dual-damascene stack of CORAL® of FIG. 5 after processing in hydrogen peroxide without any ultraviolet radiation.
Figure 10:
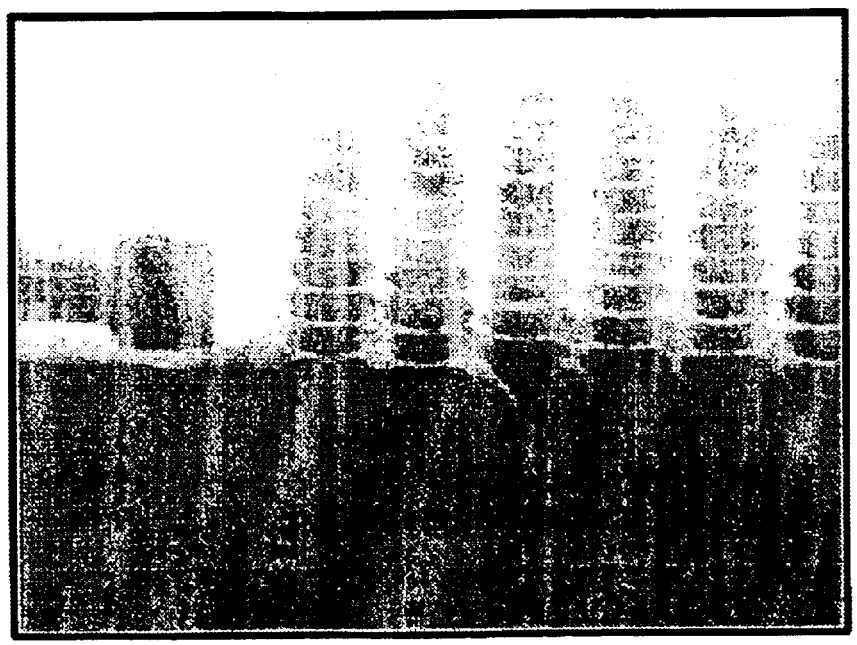
FIG. 10 depicts a copy of a SEM showing a field of vias in a dual-damascene stack of CORAL® of FIG. 5 after processing under ultraviolet radiation without any hydrogen peroxide.

FIG. 9 depicts a 20K magnification of an electron microscope photograph of a comparable CORAL® sample 70 exposed to hydrogen peroxide, but without the benefit of ultraviolet energy. As shown, this limiting process does not eliminate the photoresist layer 72. Similarly, when a sample CORAL® wafer is processed with an ultraviolet lamp, without the benefit of hydrogen peroxide, the photoresist remains. FIG. 10 depicts a 13K magnification electron microscope photograph of a CORAL® wafer processed with only an ultraviolet lamp, clearly showing the photoresist on top. Consequently, the synergy of introducing both an ultrasonic or megasonic agitation of liquid reagents close to the semiconductor wafer surface, and excitation of ozone using ultraviolet energy, produces an effective clean heretofore not realized in the art.

In this invention, the term ultra-violet excitation is used generically. The results shown in FIGS. 5, 6, 7, and 8 depict processing under a ultra-violet excimer lamp generating radiation in narrow band centered around 172 nm. This is described as an example and this invention may include, in other embodiments, irradiation by sources generating energy in other parts of the ultra-violet spectrum, for example, 248 nm, 193 nm, or 157 nm. While this invention is described generically with excitation provided using ultra-violet lamps that provide monochromatic radiation, the use of ultra-violet excimer lasers is also envisioned and can be practice within the scope of this invention. Lasers provide collimated energy in a high compressed bandwidth.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for the removal of contaminants on a semiconductor wafer surface in a process chamber comprising:
   processing said wafer with a liquid reagent mixture;
   conducting said liquid reagent mixture to said wafer surface;
   rotating said wafer on a platen;
   coupling sonic energy to a thin layer of said liquid reagent mixture on said rotating wafer surface; and
   coupling ultraviolet energy in-situ within said chamber to generate radicals at said wafer surface.

2. The method of claim 1 wherein processing said wafer with said liquid reagent mixture comprises processing with de-ionized water mixed with hydrogen peroxide.

3. The method of claim 1 wherein said liquid reagent comprises water, $H_2O_2$, ammonium hydroxide, hydrochloric acid, or hydrofluoric acid.

4. The method of claim 1 further comprising adding gas to said process chamber.

5. The method of claim 1 wherein coupling said sonic energy to a thin layer of said liquid reagent mixture comprises submerging a megasonic or ultrasonic transducer probe in a thin layer of said liquid reagent mixture on said wafer surface.

6. The method of claim 1 wherein coupling said sonic energy to a thin layer of said liquid reagent mixture comprises embedding a piezoelectric array within said platen and electrically activating said array.

7. The method of claim 6 further comprising providing electrical contact to said piezoelectric array during rotation of said wafer using brush contacts with slip rings.

8. The method of claim 2 further comprising decomposing said hydrogen peroxide into hydroxyl and peroxyl radicals by said ultraviolet energy.

9. The method of claim 1 wherein coupling said ultraviolet energy comprises illumination of ultraviolet lamps.

10. The method of claim 1 further comprising adding ozone to said liquid reagent mixture.

11. The method of claim 10 wherein said ozone is added by introducing oxygen into an ozone generator and bringing said ozone into contact with said liquid reagent mixture via a membrane module or contactor.

12. The method of claim 11 further comprising injecting said liquid reagent mixture into said chamber through a liquid inlet.

13. The method of claim 11 wherein introducing oxygen into an ozone generator comprises introducing oxygen into a corona discharge device.

14. The method of claim 1 further comprising adding ozone directly into said chamber, separately from said liquid reagent mixture.

15. The method of claim 1 wherein coupling said sonic energy to a thin layer of said liquid reagent mixture comprises submerging an ultrasonic transducer probe in a thin layer of said liquid reagent mixture on said wafer surface.

16. The method of claim 4 wherein said gas further comprises $O_2$, $O_3$, or $H_2O$ vapor.

17. The method of claim 5 wherein said chamber is adapted to raise and lower said megasonic or ultrasonic probe towards and away from said wafer.

18. The method of claim 17 wherein said probe is capable of being moved within 100 micrometers of said wafer.

19. The method of claim 17 wherein said probe is capable of being moved within 100 micrometers to 5 millimeters of said wafer.

20. The method of claim 5 wherein said probe comprises quartz, silicon carbide, or alumina.

21. The method of claim 1 wherein said ultra-violet energy is generated by ultra-violet excimer lasers.

22. A method for the removal of contaminants on a semiconductor wafer surface in a process chamber comprising:
   mixing a solution of ultrapure de-ionized water and hydrogen peroxide;
   generating ozone outside said chamber;
   combining said ozone to said de-ionizing water and said hydrogen peroxide solution outside said chamber;
   rotating said wafer; on a platen
   applying said ozone mixed with said solution to said wafer surface;
   agitating said ozone mixed with said solution at said wafer surface with a sonic energy transducer probe or piezoelectric array embedded into said platen; and
   irradiating said ozone mixed with said solution with ultraviolet energy at said wafer surface.

23. An apparatus adapted to remove contaminants on a semiconductor wafer surface comprising:
   a process chamber;
   a liquid inlet mounted on said chamber;
   a liquid reagent mixture introduced through said liquid inlet;

a rotating platen supporting said wafer;

a sonic energy probe adapted to contact a thin layer of said liquid reagent mixture on said rotating wafer surface; and an ultraviolet energy source activated in-situ within said chamber to generate radicals at said wafer surface.

24. The apparatus of claim 23 further comprising a gas inlet for adding gas to said process chamber.

25. The apparatus of claim 23 wherein said sonic energy probe comprises an embedded piezoelectric array within said platen.

26. The apparatus of claim 25 further comprising conductors and brush contacts with slip rings to provide electrical contact to said piezoelectric array during rotation of said wafer.

27. The apparatus of claim 23 wherein said ultraviolet energy source comprises ultraviolet lamps.

28. The apparatus of claim 23 wherein said ultra-violet energy source includes ultra-violet excimer lasers.

* * * * *